(12) United States Patent
Ono

(10) Patent No.: US 8,174,870 B2
(45) Date of Patent: May 8, 2012

(54) MAGNETIC RECORDING ELEMENT

(75) Inventor: Takuya Ono, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 12/557,595

(22) Filed: Sep. 11, 2009

(65) Prior Publication Data

US 2010/0027323 A1 Feb. 4, 2010

Related U.S. Application Data

(62) Division of application No. 11/682,967, filed on Mar. 7, 2007, now Pat. No. 7,626,856.

(30) Foreign Application Priority Data

Mar. 20, 2006 (JP) ................................. 2006-077387

(51) Int. Cl.
*G11C 11/00* (2006.01)
(52) U.S. Cl. ........................................ 365/158; 365/171
(58) Field of Classification Search .................. 365/158, 365/171
See application file for complete search history.

(56) References Cited

U.S. PATENT DOCUMENTS 6,671,140 B1 * 12/2003 Ishiwata ..................... 360/324.2
2005/0088787 A1 4/2005 Takahashi et al.

FOREIGN PATENT DOCUMENTS

JP 11-120758 A 4/1999
JP 2005-191032 A 7/2005

OTHER PUBLICATIONS

Yamanouchi et al.; "Current-Induced Magnetic Domain Wall Motion in a Ferromagnetic Coercivity Patterned Structure"; Physical Society of Japan, Mar. 2005, Proceedings of the 60th Annual Conference; 27a YP-5.

Yamaguchi et al.; "Real-Space Observation of Current-Driven Domain Wall Motion in Submicron Magnetic Wires"; Physical Review Letters, Feb. 20, 2004, vol. 92, No. 7; pp. 077205-1-077205-4.

* cited by examiner

*Primary Examiner* — Hoai V Ho
(74) *Attorney, Agent, or Firm* — Rossi, Kimms & McDowell LLP

(57) ABSTRACT

A magnetic recording element is disclosed for which current density required for writing is low and structure of the element is simple. It comprises a ferromagnetic fine wire formed on a Si substrate, current electrodes that contact ends of the ferromagnetic fine wire, and voltage electrodes joined to the ferromagnetic fine wire and current electrodes to measure voltage across part of the ferromagnetic fine wire in cooperation with the current electrodes. A magnetic domain wall is induced in the ferromagnetic fine wire when the element is manufactured. A depression is formed in the surface on top of the ferromagnetic fine wire between the voltage electrodes, and between one of the current electrodes and one of the voltage electrodes. Voltage is measured between the two voltage electrodes when reading current is applied, to determine whether the magnetic domain wall is present between the two voltage electrodes, whereby recorded data can be identified.

7 Claims, 7 Drawing Sheets

MAGNETIC RECORDING ELEMENT

CROSS REFERENCE TO RELATED APPLICATIONS

This is a divisional of and claims priority from U.S. patent application Ser. No. 11/682,967 filed Mar. 7, 2007 now U.S. Pat. No. 7,626,856 which in turn claims priority from JP application SN. 2006-077387, filed on Mar. 20, 2006, the contents of each of which are incorporated herein by reference in their entirety.

BACKGROUND OF THE INVENTION

A. Field of the Invention

The present invention relates to a magnetic domain wall motion-detecting terminal-possessing magnetic recording medium, and more particularly relates to a magnetic domain wall motion-detecting terminal-possessing magnetic recording element which carries out data storage by changing the state of magnetization of a ferromagnetic body.

B. Description of the Related Art

Currently, volatile memories and nonvolatile memories are used in personal computers and peripherals. With a volatile memory such as a DRAM, held data is lost when the power supply is turned off, but the rewriting and reading speeds and the degree of integration are excellent. On the other hand, with a nonvolatile memory such as a flash memory, the writing and reading speeds are poorer, but there is the advantage that data continues to be held even when the power supply is turned off.

An ideal form of memory would be one that has the advantages of both a volatile memory and a nonvolatile memory, i.e., one that has fast writing and reading speeds, and yet that continues to hold data even when the power supply is turned off. One of the most promising of such devised next generation memories is a magnetic random access memory (MRAM).

A magnetic random access memory (MRAM) according to the prior art shown in FIGS. 5A and 5B is a memory that uses a magnetic tunnel junction (MTJ) element 11 having as a basic structure a multi-layer structure of ferromagnetic free layer 12, insulator layer 13, and ferromagnetic fixed layer 14. With such an MTJ element 11, binary data is produced using the property that the resistance of a tunnel current flowing in the direction through the layers differs according to whether the magnetization directions of ferromagnetic free layer 12 and ferromagnetic fixed layer 14 are parallel or anti-parallel. The magnetization direction of a ferromagnetic body is maintained even when the current is turned off, and hence such an MRAM is a nonvolatile memory. In the drawings, the arrows within the layer indicate magnetization directions of the layers. The layer with bi-directional arrow indicates the layer in which magnetic inversion takes place.

As the structure of an MRAM, a structure in which MTJ elements 11 are disposed at points of intersection between bit lines 15 and write word lines 16 wired in a perpendicular matrix shape as shown in FIG. 5B is generally adopted. Each MTJ element 11, together with a MOS transistor that acts as a switching element for cell selection, constitutes a 1 bit cell.

Writing is carried out by passing a current through both bit line 15 and write word line 16. Upon the current being passed through both bit line 15 and write word line 16, a magnetic field induced from each of these wires is applied to the point of intersection, whereby the magnetization of ferromagnetic free layer 12 can be reversed. With bit line 15 or write word line 16 alone, the switching magnetic field required for reversing the magnetization of ferromagnetic free layer 12 is not obtained, and hence writing can be carried out to only the bit cell at the point of intersection between bit line 15 and write word line 16. Writing can thus be carried out to any chosen bit cell.

Reading is carried out by selecting a desired bit line 15 and read word line 17, and measuring the resistance of a current flowing between the bit line 15 and a reading electrode 18 connected to the read word line 17. The resistance of an MTJ element 11 can take either of two values depending on the combination of the magnetization directions of ferromagnetic free layer 12 and ferromagnetic fixed layer 14, and hence by setting an intermediate value therebetween as a reference voltage, either of two data values "1" and "0" can be obtained depending on the measured resistance.

Furthermore, in recent years, there has been developed a spin injection magnetization reversal MTJ element in which the magnetization of ferromagnetic free layer 12 is reversed by passing a spin polarized current instead of applying a magnetic field due to a current flowing through each of bit line 15 and write word line 16, and an MRAM using such spin injection magnetization reversal MTJ elements.

FIG. 6 is a view showing the structure of an MRAM using a spin injection magnetization reversal technique proposed in Japanese Patent Application Laid-open No. 11-120758. Writing is carried out as follows. Consider a current being passed such that electrons are injected from ferromagnetic fixed layer 14 into ferromagnetic free layer 12. The spin of an electron passing through ferromagnetic fixed layer 14 undergoes exchange interaction with the magnetization of ferromagnetic fixed layer 14 and thus receives spin torque from the magnetization, and hence is polarized in the magnetization direction of ferromagnetic fixed layer 14. When the spin polarized electron enters ferromagnetic free layer 12, the electron now gives spin torque to the magnetization of ferromagnetic free layer 12. In this way, the magnetization of ferromagnetic free layer 12 is aligned so that it is parallel with the magnetization of ferromagnetic fixed layer 14.

On the other hand, when a current is passed such that electrons are injected from ferromagnetic free layer 12 into ferromagnetic fixed layer 14, electrons each having a spin anti-parallel to the magnetization of ferromagnetic fixed layer 14 are reflected at the interface between ferromagnetic fixed layer 14 and insulator layer 13, and the reflected electrons give a spin torque to the magnetization of ferromagnetic free layer 12. As a result, the magnetization of ferromagnetic free layer 12 becomes anti-parallel to the magnetization of ferromagnetic fixed layer 14.

Through the above effects, by selecting the direction of the current applied to the multi-layer film, the magnetizations of ferromagnetic fixed layer 14 and ferromagnetic free layer 12 can be made to be parallel or anti-parallel to one another. Actually carrying out writing by reversing the magnetization of ferromagnetic free layer 12 using a current requires a current greater than a certain current, i.e., a critical current. When reading, a current less than the critical current is passed, and the data is read by measuring the resistance as with a conventional MRAM.

With an MRAM using the spin injection magnetization reversal technique, compared with a conventional MRAM, the write word lines 16 for producing a writing magnetic field are not required, and hence there is an advantage that the structure of the element can be simplified. However, with the spin injection magnetization reversal technique, the critical current density required for magnetization reversal is approximately $5 \times 10^7$ A/cm$^2$, and hence there is a problem that the current density is high.

In Japanese Patent Application Laid-open No. 2005-191032, there is thus proposed an MRAM of a type in which a magnetic domain wall in ferromagnetic free layer 12 is moved using a current-driven magnetic domain wall motion technique of moving the magnetic domain wall in the ferromagnetic body by applying a current, instead of the spin injection magnetization reversal technique. It is thought that current-driven magnetic domain wall motion is produced through two effects, namely magnetization alignment due to spin torque given to the magnetization of the ferromagnetic body by the electron spin of the applied current, and momentum transferring from the electrons to the magnetic domain wall accompanying electron scattering by the magnetic domain wall.

Following is a description of the MRAM using the current-driven magnetic domain wall motion technique proposed in Japanese Patent Application Laid-open No. 2005-191032 with reference to FIG. 7. Insulator layer 13 and ferromagnetic fixed layer 14 are laminated on ferromagnetic free layer 12, and a read word line (not shown) is connected to ferromagnetic fixed layer 14 via reading electrode 18. On the other hand, writing electrodes 19a and 19b are formed at respective ends of ferromagnetic free layer 12.

As shown in FIG. 7A, when magnetic domain wall 20 is to the left in the drawing of a multi-layer portion including ferromagnetic fixed layer 14, and the magnetizations of ferromagnetic free layer 12 and ferromagnetic fixed layer 14 are aligned parallel to one another, if a current is passed to writing electrode 19b from reading electrode 18, then the element exhibits low resistance.

To carry out data recording, current 21 is passed from writing electrode 19b to writing electrode 19a. Through the application of the current, magnetic domain wall 20 moves to the right in the drawing, and hence the magnetization of ferromagnetic free layer 12 at the multi-layer portion and the magnetization of ferromagnetic fixed layer 14 become anti-parallel to one another. If a current is passed from reading electrode 18 to writing electrode 19b in this state, then the element now exhibits high resistance.

As described above, using the current-driven magnetic domain wall motion technique, the magnetization of ferromagnetic free layer 12 of the MTJ element can be reversed and yet, unlike with an MRAM using the spin injection magnetization reversal technique, current is applied to only the ferromagnetic free layer, and hence there is the advantage that the power consumption can be reduced.

However, with MRAMs of the prior art, it has been difficult to achieve both making the elements minute so as to increase the recording density and simplifying the structure to realize this, and reducing the writing current. With the MRAM using the spin injection magnetization reversal technique, simplification of the structure is realized by omitting the writing elements. However, the current density required for the spin injection magnetization reversal has not yet been reduced to an extent that practical implementation is possible. On the other hand, with the MRAM using the current-driven magnetic domain wall motion technique, electrodes for applying a writing current for moving the magnetic domain wall in the ferromagnetic free layer are formed, whereby the current required for writing is reduced. However, it is still necessary to form a multi-layer portion including ferromagnetic fixed layer 14, and hence the structure is complex.

The present invention is directed to overcoming or at least reducing the effects of one or more of the problems set forth above.

SUMMARY OF THE INVENTION

The present invention has been devised in view of the above problems; it is an object of the present invention to provide a simple magnetic recording element of the magnetic domain wall motion-detecting terminal-possessing type for which the writing current can be kept low, and the element has a small structure.

It is an object of the invention to provide a magnetic recording element of the magnetic domain wall motion detecting terminal-possessing magnetic domain wall motion type, for which the current density required for writing is low, and the structure of the element is simple. The element comprises ferromagnetic fine wire 1 formed on an Si substrate, current electrodes 2a and 2b that contact respective ends of ferromagnetic fine wire 1, and voltage electrodes 4a and 4b that are joined to ferromagnetic fine wire 1 and current electrodes 2a and 2b so as to be able to measure the voltage across a part of ferromagnetic fine wire 1 in cooperation with current electrodes 2a and 2b. Magnetic domain wall 3 is induced in ferromagnetic fine wire 1 when the element is manufactured. Depression 5 is formed in the surface on top of ferromagnetic fine wire 1 between voltage electrodes 4a and 4b, and between current electrode 2a and voltage electrode 4a, using means such as ion beam etching. The voltage between voltage electrode 4a and voltage electrode 4b when reading current 8 is applied is measured, so as to investigate whether or not magnetic domain wall 3 is present between voltage electrode 4a and voltage electrode 4b, whereby recorded data can be identified.

Thus, the present invention provides a magnetic recording element of the magnetic domain wall motion-detecting terminal-possessing magnetic domain wall motion type, comprising a ferromagnetic body, a first electrode pair joined to the ferromagnetic body, and a second electrode pair joined to a surface of the ferromagnetic body to which the first electrode pair is not joined and/or to part of the first electrode pair, wherein the second electrode pair comprises a first electrode and a second electrode. The first electrode and the second electrode are disposed such that a potential difference arises between the second electrode pair when a current is passed between the first electrode pair, at least one of the first electrode and the second electrode is joined to the ferromagnetic body such that a gap is created between the one of the first electrode pair in which a magnetic domain wall can be held, and the ferromagnetic body has at least one magnetic domain wall induced therein.

In one embodiment, the first electrode and the second electrode are disposed on the same surface.

In another embodiment, the first electrode and the second electrode are disposed on surfaces facing one another.

In a further embodiment, the first electrode and the second electrode are disposed on surfaces adjacent to one another.

Also provided according to the invention is a magnetic recording element according to any of these embodiments, further comprising means for passing a current having a first current density between the first electrode pair, so as to move the magnetic domain wall through the ferromagnetic body.

Yet another embodiment further comprises means for passing a current having a second current density between the first electrode pair, and measuring a voltage between the second electrode pair, so as to detect the number of the magnetic domain walls present within the ferromagnetic body between positions of joints with the second electrode pair.

In another embodiment, the number of the magnetic domain walls present within the ferromagnetic body between positions of joints with the second electrode pair is correlated to recorded data.

A further embodiment additionally comprises means for applying a first magnetic field greater than a coercivity of the ferromagnetic body to the ferromagnetic body so as to subject the ferromagnetic body to saturation magnetization, means for heating one of the first electrode pair joined to the ferromagnetic body so as to heat one end only of the ferromagnetic body, and means for applying to the ferromagnetic body a second magnetic field that is anti-parallel to the first magnetic field and has a magnitude less than the coercivity and sufficient to enable only the heated portion of the ferromagnetic body to be subjected to magnetization reversal, thus subjecting only the heated portion of the ferromagnetic body to magnetization reversal so as to induce the magnetic domain wall.

According to the present invention, an MRAM can be realized for which the current density required for writing is low, and which is small and has a simple element structure.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Embodiment 1

Figure 1A:
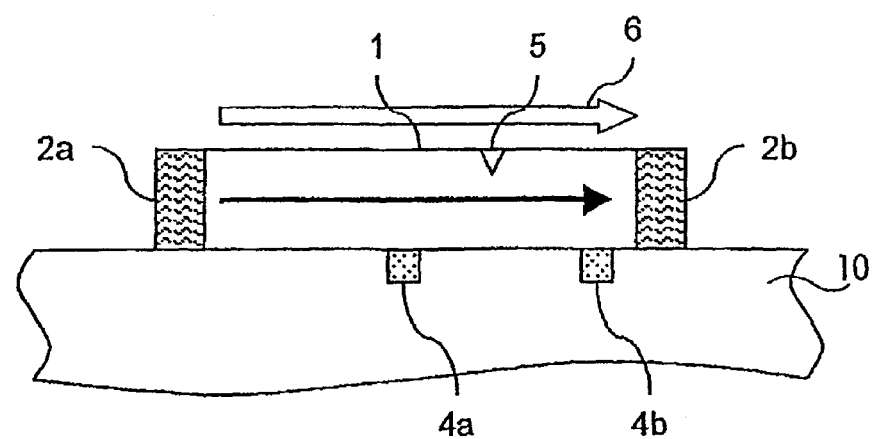
FIGS. 1A and B are sectional views showing the structure of a magnetic recording element before a magnetic domain wall is induced according to Embodiment 1 of the present invention.

Following is a detailed description of embodiments of the present invention with reference to the drawings. Note that in the drawings described below, elements having the same function are designated by the same reference numeral, and repeated description is omitted.

Figure 1B:
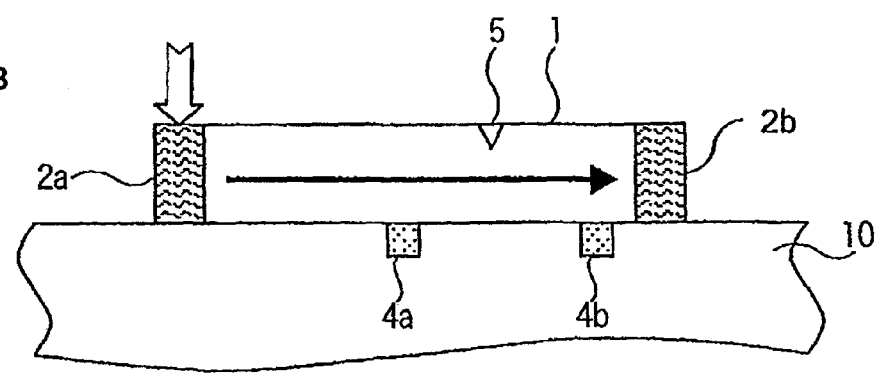
FIG. 1C is a sectional view showing the structure of the magnetic recording element after the magnetic domain wall has been induced according to Embodiment 1 of the present invention.
Figure 1C:
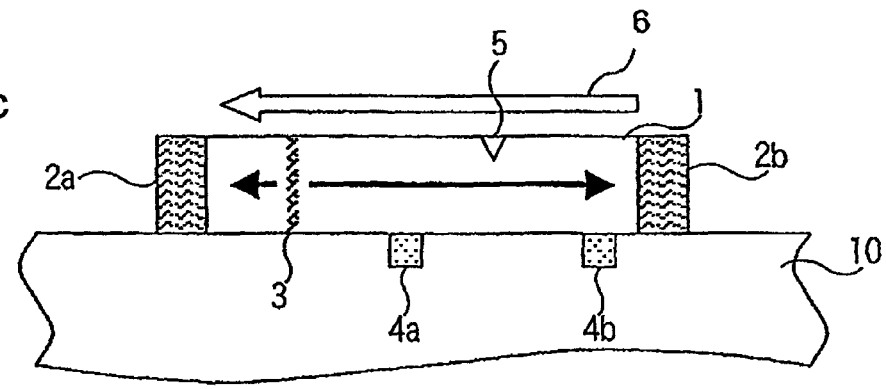

FIGS. 1A to 1C are sectional views showing the structure of a magnetic recording element of the magnetic domain wall motion-detecting terminal-possessing magnetic domain wall motion type according to Embodiment 1 of the present invention. The element comprises ferromagnetic fine wire 1 formed on Si substrate 10, current electrodes 2a and 2b that are formed in contact with respective ends of ferromagnetic fine wire 1, and voltage electrodes 4a and 4b that are embedded in substrate 10 and joined to ferromagnetic fine wire 1.

In the present embodiment, voltage electrode 4a is positioned approximately in the center of ferromagnetic fine wire 1, and voltage electrode 4b is disposed close to current electrode 2b, but there is no limitation to this arrangement. As described below, voltage electrodes 4a and 4b are electrodes used when reading data, it being determined whether data is "0" or "1" from the voltage between voltage electrode 4a and the voltage electrode 4b. This data changes according to whether or not there is a magnetic domain wall between voltage electrode 4a and voltage electrode 4b, and hence there must be a region in which a magnetic domain wall will stop between voltage electrode 4a and voltage electrode 4b in the ferromagnetic fine wire. Furthermore, because the above data corresponds to the voltage between voltage electrode 4a and voltage electrode 4b, voltage electrode 4a and voltage electrode 4b must be separated from one another by a predetermined gap. Moreover, because there must be a case when there is and a case when there is not a magnetic domain wall between voltage electrode 4a and voltage electrode 4b in the ferromagnetic fine wire, there must be formed in the ferromagnetic fine wire a region that is between the voltage electrodes 4a and 4b (referred to as the "first region" in the present specification) and a region that is not between the voltage electrodes 4a and 4b (referred to as the "second region" in the present specification). That is, so long as voltage electrodes 4a and 4b are disposed such that a magnetic domain wall can be held in each of the first region or the second region, voltage electrodes 4a and 4b may be disposed anywhere.

Note that because the second region is a region that is not between voltage electrode 4a and voltage electrode 4b in the ferromagnetic fine wire, in FIGS. 1A to 1C, the second region is the region between current electrode 2a and voltage electrode 4a. Alternatively, the second region may be the region between current electrode 2b and voltage electrode 4b.

Voltage electrodes 4a and 4b are disposed such that the voltage of a current flowing between current electrode 2a and current electrode 2b can be measured. In the present embodiment, voltage electrodes 4a and 4b are not limited to being embedded in substrate 10, but rather may alternatively be formed on substrate 10, or on a surface of ferromagnetic fine wire 1 facing substrate 10. Furthermore, in the present embodiment, voltage electrodes 4a and 4b are both formed on the same surface, but there is no limitation to this; voltage electrodes 4a and 4b may alternatively be formed on different surfaces to one another such as surfaces of ferromagnetic fine wire 1 facing one another or adjacent surfaces. That is, voltage electrodes 4a and 4b are joined to ferromagnetic fine wire 1 and current electrodes 2a and 2b such that, as described below, when a current is passed between current electrodes 2a and 2b, the voltage across a part of ferromagnetic fine wire 1 can be measured in cooperation with current electrodes 2a and 2b. That is, voltage electrodes 4a and 4b are such that, when a current is passed between current electrodes 2a and 2b, a potential difference arises between voltage electrodes 4a and 4b, so that the voltage can be measured.

In Embodiment 1, $Ni_{80}Fe_{20}$ Permalloy is used for ferromagnetic fine wire 1, and ferromagnetic fine wire 1 has a length of 200 nm, a width of 10 nm, and a height of 10 nm. Here, the length is the distance in the direction between current electrodes 2a and 2b, the width is the distance in the direction in the plane of the substrate orthogonal to the length direction, and the height is the distance in the direction perpendicular to the substrate. Moreover, in Embodiment 1, an axis of easy magnetization of ferromagnetic fine wire 1 is disposed such that the magnetization is oriented parallel to the substrate plane.

In the present embodiment, when the element is manufactured, one magnetic domain wall 3 is induced in ferromagnetic fine wire 1. In Embodiment 1, by applying magnetic field 6 sufficiently greater than the coercivity of ferromagnetic fine wire 1 over the whole of ferromagnetic fine wire 1, the whole of ferromagnetic fine wire 1 is subjected to saturation magnetization (FIG. 1A). As the method of subjecting the whole of ferromagnetic fine wire 1 to saturation magnetization, for example, there is a method of magnetizing by applying a magnetic field produced between the S pole and the N pole of a strong permanent magnet of NdCo type (NdCoB), SmCo type (SmCo) or the like. Moreover, in an alternative, there is a method in which the magnetic field is applied by placing the element in a strong magnetic field produced by a superconductive coil. The magnitude of the magnetic field produced by either of these methods is preferably 8000 to 15000 oersted.

Next, current electrode 2a is heated by irradiating with a laser or the like, so that the temperature of the portion of ferromagnetic fine wire 1 contacting current electrode 2a rises (FIG. 1B). Alternatively, a current may be passed into current electrode 2a, so that current electrode 2a itself generates heat, thus raising the temperature of a portion of ferromagnetic fine wire 1.

Then, magnetic field 6 less than the coercivity of the ferromagnetic fine wire 1 is applied in a direction opposite to that of the initially applied magnetic field (FIG. 1C). The coercivity is reduced in the portion of ferromagnetic fine wire 1 of raised temperature, and hence magnetization reversal is brought about at a magnetic field lower than the original coercivity. The temperature distribution of ferromagnetic fine wire 1 is such that the temperature decreases monotonically with increasing separation from heated current electrode 2a, and hence only one magnetic domain is newly produced accompanying the magnetization reversal, and thus only one magnetic domain wall 3 is produced. Moreover, because ferromagnetic fine wire 1 is a thin film that stretches out parallel to the substrate plane, the magnetic domain wall produced at this time is perpendicular to the substrate plane. As the method of applying magnetic field 6 less than the coercivity of ferromagnetic fine wire 1, for example, there is a method of magnetizing by applying a magnetic field produced between the S pole and the N pole of a strong permanent magnet of NdCo type (NdCoB), SmCo type (SmCo) or the like. Here, the strength of the magnetic field produced is adjusted by making the gap between the S pole and the N pole larger than the gap between the S pole and the N pole of the permanent magnet used when subjecting the whole of ferromagnetic fine wire 1 to saturation magnetization. Moreover, other than this, the magnetization can also be carried out by applying a strong magnetic field produced by a superconductive coil. Here, the strength of the magnetic field produced is adjusted by reducing the number of turns of the superconductive coil or the current. The magnitude of the magnetic field produced using either of these methods is less than the coercivity of ferromagnetic fine wire 1, for example, and may be approximately a few tens to a few hundreds of oersted.

In this way, the application of the magnetic field in FIG. 1A is carried out to subject the whole of ferromagnetic fine wire 1 to saturation magnetization in a certain direction, and then the application of the magnetic field in FIG. 1C is carried out to induce a magnetic domain wall in ferromagnetic fine wire 1 that has been subjected to the saturation magnetization in that direction. Accordingly, in the present embodiment, the directions of the magnetic fields are not limited to those in FIGS. 1A and 1C, but rather may be in any direction so long as the direction of the magnetic field for subjecting the whole of ferromagnetic fine wire 1 to saturation magnetization and the direction of the magnetic field for inducing the magnetic domain wall are opposite to one another.

As another method of introducing the magnetic domain wall, there is a method in which part of the magnetization in ferromagnetic fine wire 1 is fixed, and then a magnetic field is applied over the whole of ferromagnetic fine wire 1, so as to reverse the non-fixed magnetization and thus induce a magnetic domain wall. As the method of fixing the magnetization, there is a method in which an anti-ferromagnetic film of IrMn or the like is formed in a magnetic field close to current electrode 2a on top of ferromagnetic fine wire 1 so as to bring about exchange coupling with the magnetization of ferromagnetic fine wire 1. Alternatively, there is a method in which Ru and a ferromagnetic fixed layer are formed close to current electrode 2a on top of ferromagnetic fine wire 1, and the magnetization of the ferromagnetic fixed layer and the magnetization of ferromagnetic fine wire 1 are made to undergo anti-ferromagnetic coupling, thus fixing the magnetization of ferromagnetic fine wire 1 under the anti-ferromagnetic film. In Embodiment 1, such a method has not been adopted since the structure of the element would become complex, but there is an advantage that heating is not required with such a method. Here, on top of ferromagnetic fine wire 1 in the present specification means the side of the surface of ferromagnetic fine wire 1 opposite the surface contacting the substrate.

Depression (defect) 5 is formed in the surface on top of ferromagnetic fine wire 1 between voltage electrodes 4a and 4b using means such as ion beam etching. Depression 5 has an effect of pinning magnetic domain wall 3 moving through ferromagnetic fine wire 1. That is, magnetic domain wall 3 can be moved accurately to the position of depression 5.

Figure 2A:
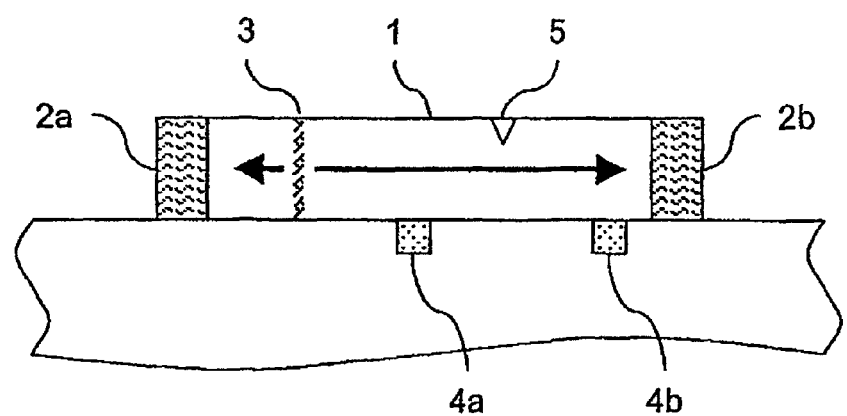
FIG. 2A is a view showing the magnetic recording element according to Embodiment 1 of the present invention in a state in which a magnetic domain wall is not present between voltage electrodes.
Figure 2B:
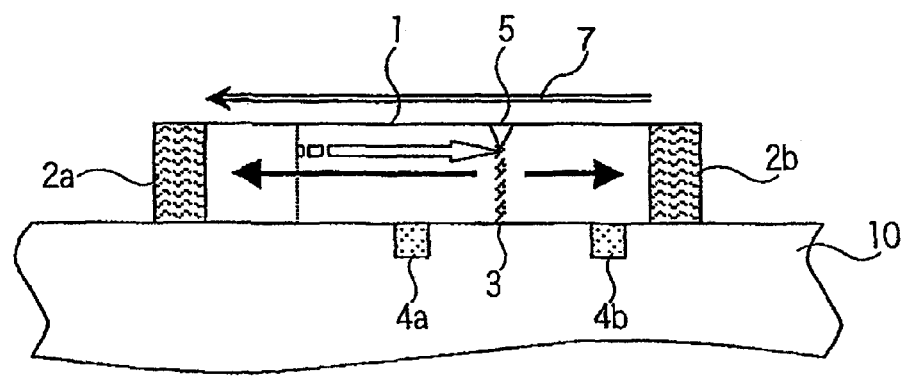
FIG. 2B is a view showing data writing for the magnetic recording element according to Embodiment 1 of the present invention by moving a magnetic domain wall to a position between the voltage electrodes.
Figure 2C:
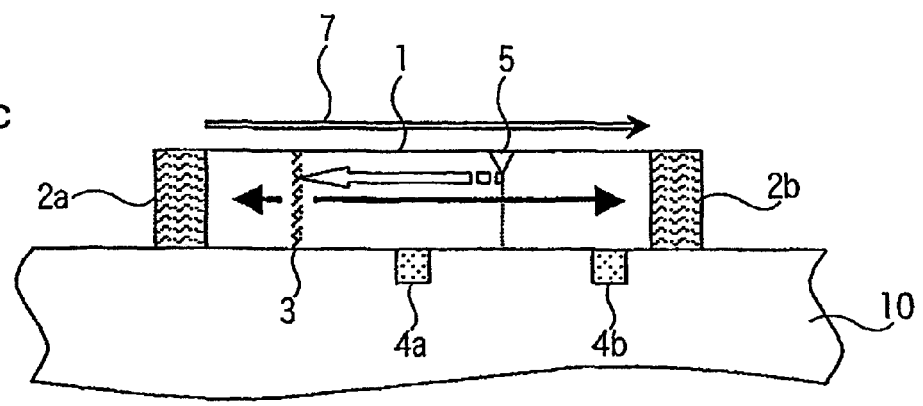
FIG. 2C is a view showing data writing for the magnetic recording element according to Embodiment 1 of the present invention by moving the magnetic domain wall to a position that is not between the voltage electrodes.

Next, FIGS. 2A to 2C show views explaining a data writing method for a magnetic recording element of the magnetic domain wall motion-detecting terminal-possessing magnetic domain wall motion type according to an embodiment of the present invention. The procedure of data writing will be described with reference to FIGS. 2A to 2C. At a stage in which the magnetic domain wall has been initially produced (FIG. 1C), magnetic domain wall 3 is positioned close to current electrode 2a, i.e., to the left of voltage electrode 4a in the drawings (in the second region). This state in which magnetic domain wall 3 is in the second region will be taken as data "0" (FIG. 2A).

Upon a current (writing current 7) being passed from current electrode 2b to current electrode 2a, magnetic domain wall 3 moves from close to current electrode 2a (the left in the drawings) toward current electrode 2b (the right in the drawings). The current is applied for a predetermined time such that magnetic domain wall 3 enters into the region between voltage electrode 4a and voltage electrode 4b (the first region) and stops at the position of depression 5. This state in which magnetic domain wall 3 is in the first region will be taken as data "1" (FIG. 2B). Here, the predetermined time for which the current is applied can be calculated from the speed at which magnetic domain wall 3 moves through ferromagnetic fine wire 1, which is measured in advance, and the distance from close to current electrode 2a to the first region.

To return from the data "1" state to the data "0" state, writing current 7 is passed from current electrode 2a to current electrode 2b, so as to move magnetic domain wall 3 from the position of depression 5 to close to current electrode 2a which is to the left of voltage electrode 4a, i.e., into the second region (FIG. 2C). Note that another depression may be formed between current electrode 2a and voltage electrode 4a so that magnetic domain wall 3 can also be pinned easily in the second region.

According to Yamanouchi, Michibiko, et al., "Current-Induced Magnetic Domain Wall Motion in a Ferromagnetic Coercivity Patterned Structure", *Physical Society of Japan*, March 2005, Proceedings of the 60$^{th}$ Annual Conference, 27a YP-5 (in Japanese), the optimum current density for magnetic domain wall motion in an $Ni_{80}Fe_{20}$ permalloy fine wire is approximately $8\times10^4$ A/cm$^2$, and this corresponds to passing a current of approximately 10 pA in Embodiment 1. Moreover, according to A. Yamaguchi, "Real-Space Observation of Current-Driven Domain Wall Motion in Submicron Magnetic Wires," *Phys. Rev. Lett.*, 2004 vol. 92, 077205, the speed of movement of the magnetic domain wall is approximately 3 m/s. Hence, taking the distance through which the magnetic domain wall is moved when carrying out recording in Embodiment 1 to be approximately 150 nm, if the time for which the current is applied is made to be approximately 50 ns, then the magnetic domain wall can be moved between close to current electrode 2a and depression 5 as described above. That is, under the conditions in A. Yamaguchi, "Real-Space Observation of Current-Driven Domain Wall Motion in Submicron Magnetic Wires," *Phys. Rev. Lett.*, 2004 vol. 92, 077205, the switching time for the element is 50 ns, i.e., a switching speed approximately the same as that for a currently available flash memory can be realized. On the other hand, the speed of current-driven magnetic domain wall motion is predicted from theory to be approximately 10 m/s, and hence it is thought that ultimately it will be possible to improve the switching time to a few ns.

Figure 3A:
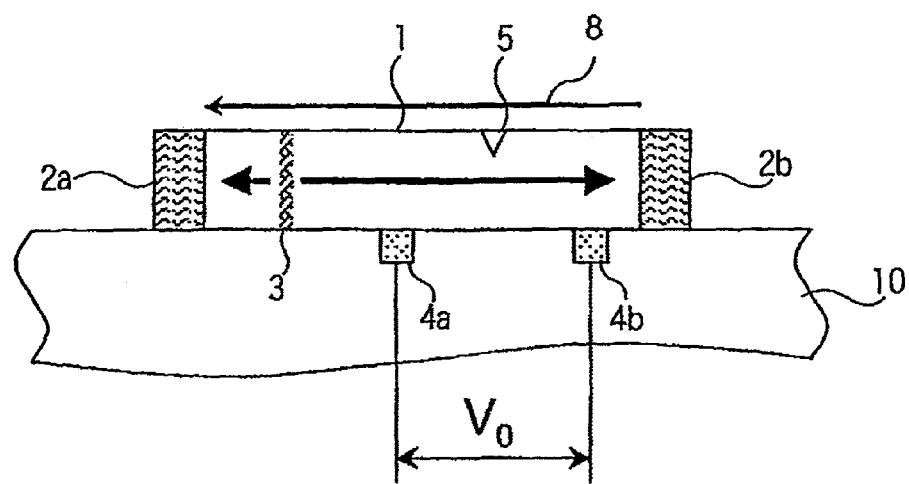
FIG. 3A is a view showing data reading for the magnetic recording element according to Embodiment 1 of the present invention in a state in which the magnetic domain wall is not present between the voltage electrodes.
Figure 3B:
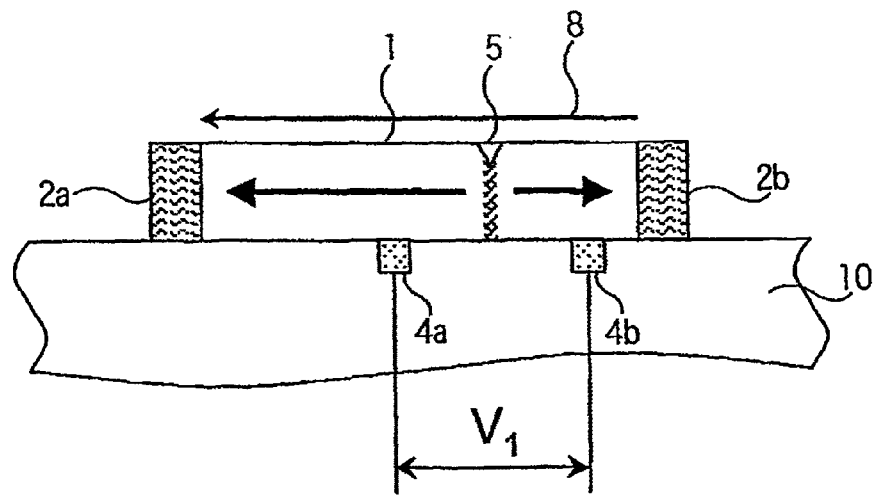
FIG. 3B is a view showing data reading for the magnetic recording element according to Embodiment 1 of the present invention in a state in which the magnetic domain wall is present between the voltage electrodes.

FIGS. 3A and 3B show views for explaining a data reading method for the magnetic recording element of the magnetic domain wall motion-detecting terminal-possessing magnetic domain wall motion type according to Embodiment 1 of the present invention. As shown in FIGS. 3A and 3B, data reading is carried out by passing a current from current electrode 2a to current electrode 2b, i.e., reading current 8, and measuring the electrical resistance of ferromagnetic fine wire 1. The magnitude of reading current 8 must be such that magnetic domain wall motion is not induced, and in Embodiment 1 is made to be 5 nA. In ferromagnetic fine wire 1, the change in the electrical resistance according to whether or not magnetic domain wall 3 is present can be measured, and hence the recorded data can be identified from the value of the electrical resistance, i.e., the data can be read. In Embodiment 1, when reading current 8 is applied, the voltage between voltage electrode 4a and voltage electrode 4b is measured, in order to investigate whether or not magnetic domain wall 3 is present between voltage electrode 4a and voltage electrode 4b, whereby the recorded data can be identified.

In the present embodiment, voltage electrodes 4a and 4b disposed so as to form the first and second regions are able to measure the voltage change corresponding to the number of magnetic domain walls present (in the present embodiment, the voltage according to whether there are 0 or 1 magnetic domain walls, and in Embodiment 2, the voltage according to whether there are 0, 1 or 2 magnetic domain walls). The measured voltage between voltage electrode 4a and voltage electrode 4b corresponds to the data, and hence voltage electrodes 4a and 4b act as means for reading the data.

In the present embodiment, in the magnetic domain wall motion type magnetic recording element, data writing and reading are not carried out by providing a ferromagnetic fixed layer and a ferromagnetic free layer and making the magnetizations of these layers be parallel or anti-parallel as conventionally, but rather through whether or not there is a magnetic domain wall in a region for reading data, i.e., between voltage electrodes, in a ferromagnetic layer. There is thus no need to provide a ferromagnetic fixed layer as conventionally, and hence the structure of the element can be made simpler and thus the element can be made smaller.

Embodiment 2

In Embodiment 1, the number of magnetic domain walls was limited to one, but by increasing the number of magnetic domain walls introduced, multi-value recording can be realized.

Figure 4A:
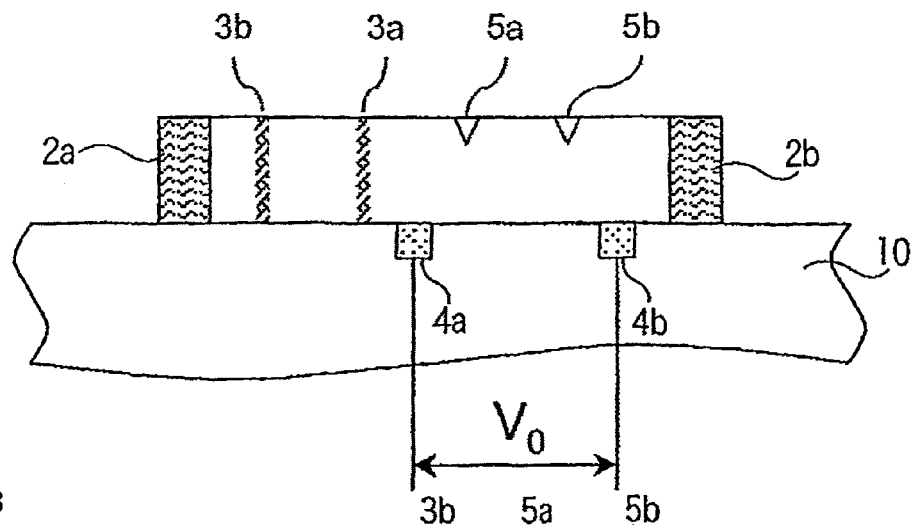
FIG. 4A is a view showing a magnetic recording element according to Embodiment 2 of the present invention in a state in which there is no magnetic domain wall between voltage electrodes.
Figure 4B:
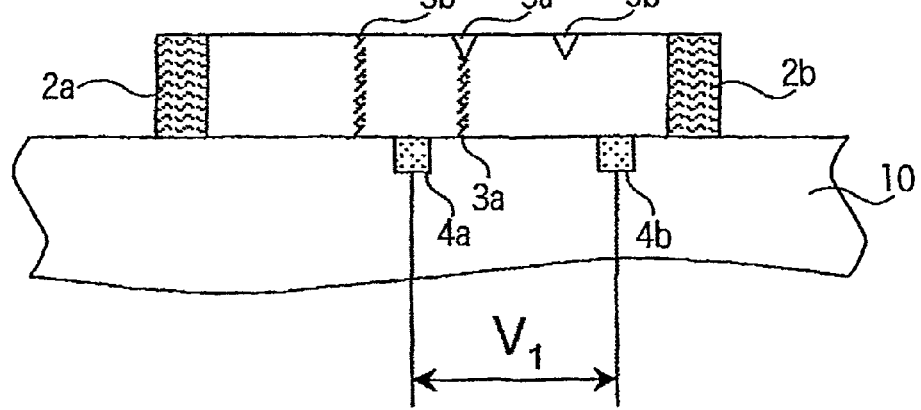
FIG. 4B is a view showing the magnetic recording element according to Embodiment 2 of the present invention in a state in which there is one magnetic domain wall between the voltage electrodes.
Figure 4C:
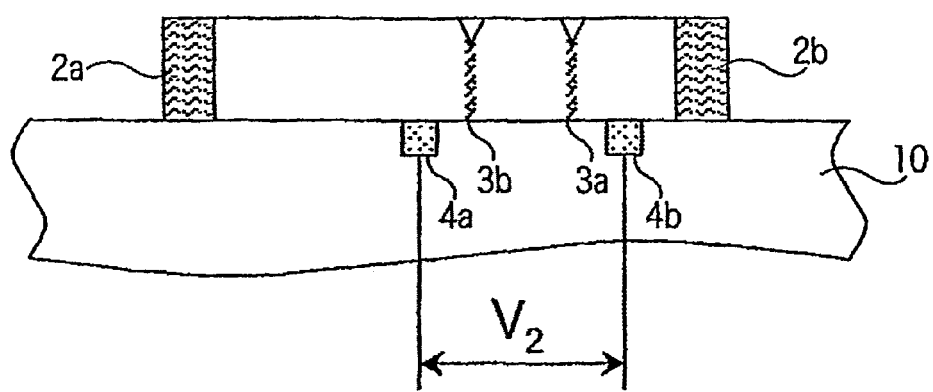
FIG. 4C is a view showing the magnetic recording element according to Embodiment 2 of the present invention in a state in which there are two magnetic domain walls between the voltage electrodes.
Figure 5A:
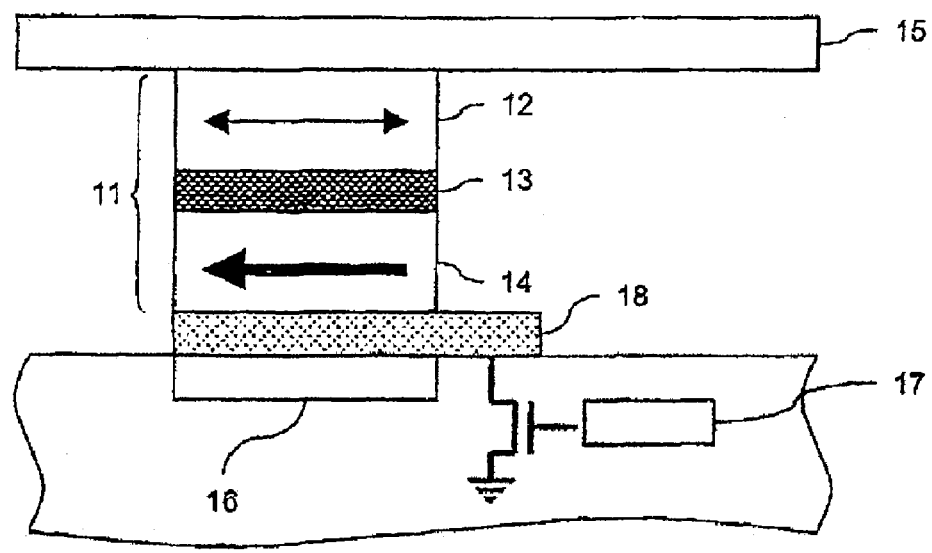
FIG. 5A is a sectional view showing the structure of an MTJ element according to prior art.
Figure 5B:
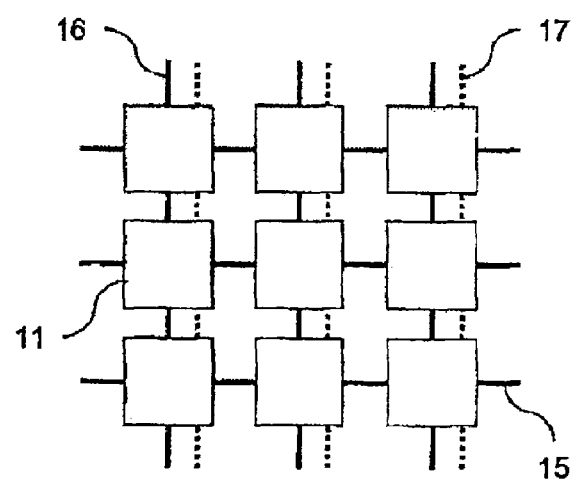
FIG. 5B is a view showing the structure of an MRAM in which are integrated such MTJ elements according to the prior art.
Figure 6:
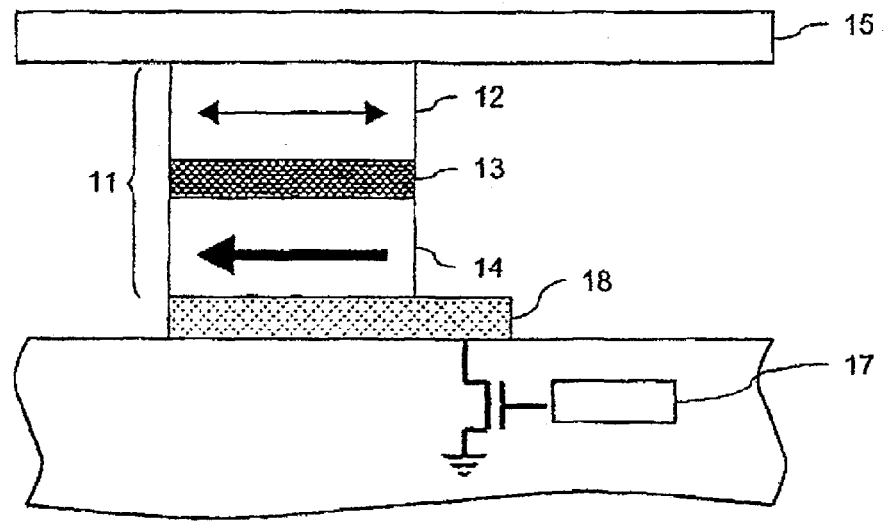
FIG. 6 is a view showing the structure of an MTJ element using a spin injection magnetization reversal technique according to prior art.
Figure 7A:
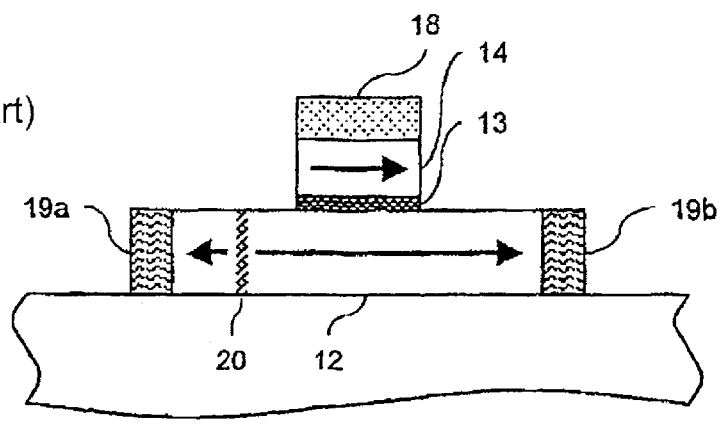
FIG. 7A is a view showing the structure of an MTJ element using a current-driven magnetic domain wall motion technique according to prior art in a state in which a magnetic domain wall is on a current electrode 19a side.
Figure 7B:
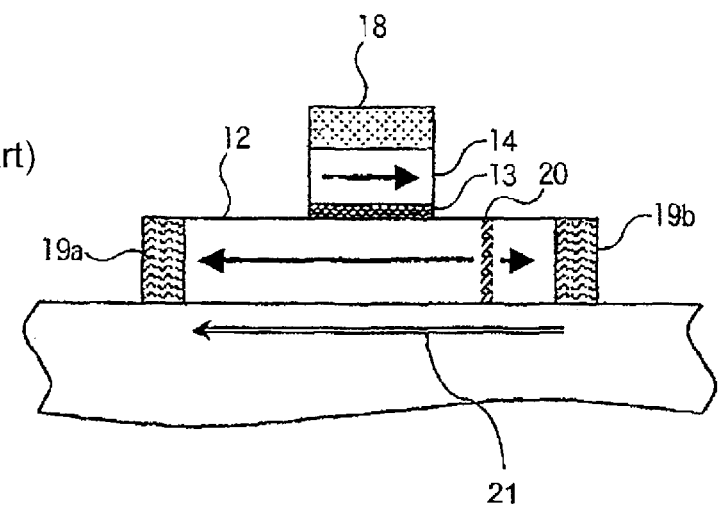
FIG. 7B is a view showing the structure of the MTJ element using the current-driven magnetic domain wall motion technique according to the prior art in a state in which the magnetic domain wall is on a current electrode 19b side.

FIGS. 4A to 4C show views for explaining data writing and reading methods for a magnetic recording element of the magnetic domain wall motion-detecting terminal-possessing magnetic domain wall motion type according to Embodiment 2 of the present invention. In Embodiment 2, two magnetic domain walls are introduced, whereby ternary recording can be carried out.

The structure of the element in Embodiment 2 is the same as in Embodiment 1 with regard to ferromagnetic fine wire 1, current electrodes 2a and 2b, and voltage electrodes 4a and 4b. The difference is that whereas one depression 5 for pinning a magnetic domain wall was created in Embodiment 1, two such depressions 5 are created in Embodiment 2, and two magnetic domain walls are induced in ferromagnetic fine wire 1 when manufacturing the element.

The two magnetic domain walls are induced as follows. Firstly, as in the first embodiment, a magnetic field sufficiently greater than the coercivity of ferromagnetic fine wire 1 is applied to ferromagnetic fine wire 1, thus subjecting the whole of ferromagnetic fine wire 1 to saturation magnetization. Current electrode 2a is then heated by irradiating with a laser or the like, so that the temperature of the portion of ferromagnetic fine wire 1 contacting current electrode 2a rises. In addition, a magnetic field less than the coercivity of ferromagnetic fine wire 1 is applied in a direction opposite to that of the initially applied magnetic field, thus producing first magnetic domain wall 3a.

After first magnetic domain wall 3a has been produced, a current is passed from current electrode 2b to current electrode 2a, thus moving magnetic domain wall 3a from close to current electrode 2a (the left in the drawings) toward current electrode 2b (the right in the drawings), the current being stopped once magnetic domain wall 3a has reached the position of depression 5a on the left in the drawings. In this state, current electrode 2a is again heated, and a magnetic field is applied in the opposite direction to that used when inducing magnetic domain wall 3a, whereupon second magnetic domain wall 3b is induced close to current electrode 2a. In this way, two magnetic domain walls, i.e., magnetic domain walls 3a and 3b, can be induced in ferromagnetic fine wire 1. Finally, a current is passed from current electrode 2a to current electrode 2b, thus collecting together the two magnetic domain walls close to current electrode 2a The procedure for recording is as follows. Take the state in which the two magnetic domain walls are close to current electrode 2a, i.e., are positioned to the left of voltage electrode 4a in the drawings, to be data "0".

When writing current 7 is passed from current electrode 2b to current electrode 2a, the magnetic domain walls move from close to current electrode 2a (the left in the drawings) toward current electrode 2b (the right in the drawings). The current is applied for a predetermined time such that the magnetic domain wall on the right in the drawings enters into the region between voltage electrode 4a and voltage electrode 4b and stops at the position of first depression 5a. This state is taken as data "1".

Writing current 7 is then further passed from current electrode 2b to current electrode 2a, writing current 7 being applied for a predetermined time such that magnetic domain walls 3a and 3b both enter into the region between voltage electrode 4a and voltage electrode 4b, and reach the positions of depressions 5a and 5b respectively. This state is taken as data "2".

The moving between data "0", data "1", and data "2", i.e., the moving of magnetic domain walls 3a and 3b to predetermined positions corresponding to the respective states, can be controlled by suitably administering the direction in which the current is applied and the time for which the current is applied.

Data reading is carried out as in Embodiment 1 by passing reading current 8 from current electrode 2a to current electrode 2b, and measuring the voltage between voltage electrode 4a and voltage electrode 4b. The magnitude of the voltage between voltage electrode 4a and voltage electrode 4b is proportional to the number of magnetic domain walls between voltage electrode 4a and voltage electrode 4b, and hence the number of magnetic domain walls between voltage electrode 4a and voltage electrode 4b can be investigated from the magnitude of the voltage, whereby the recorded data can be identified.

Embodiment 3

Figure 8:
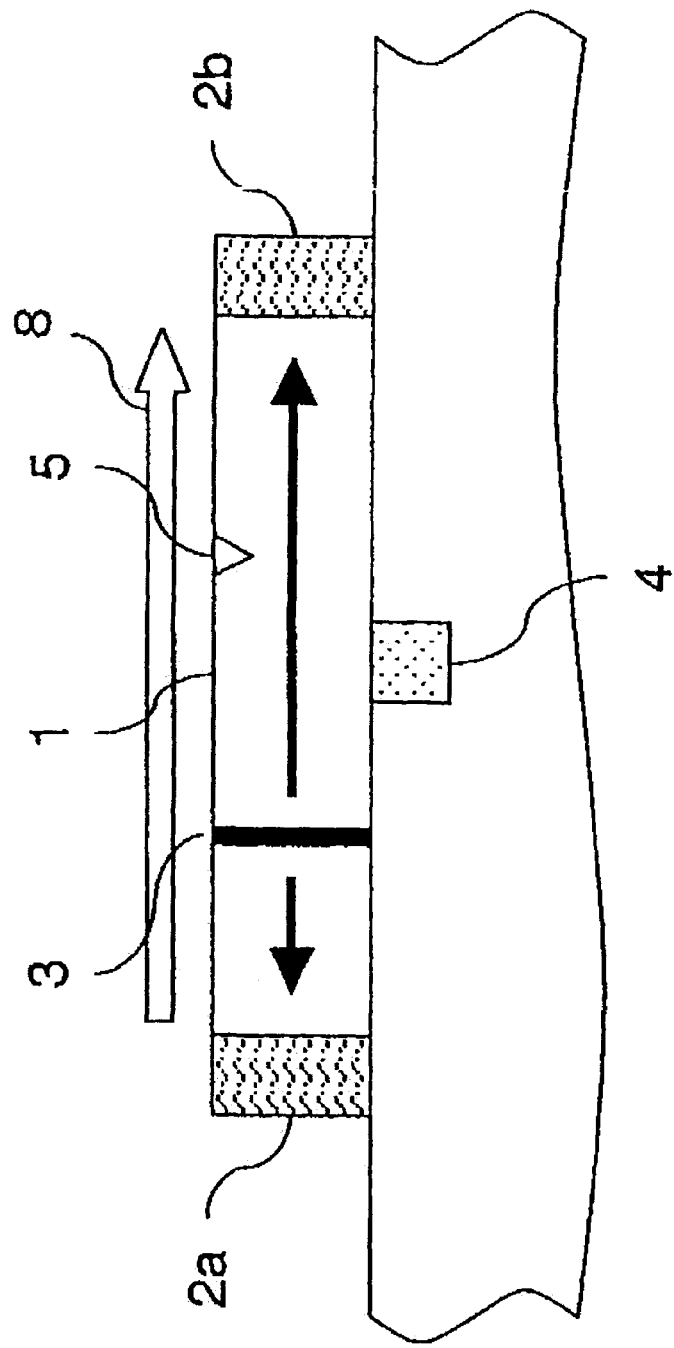
FIG. 8 is a sectional view showing the structure of a magnetic domain wall motion-detecting terminal-possessing magnetic domain wall motion type magnetic recording element according to Embodiment 3 of the present invention.

In Embodiment 1, current electrodes 2a and 2b, and voltage electrodes 4a and 4b are separated from all the other electrodes. In Embodiment 1, between current electrodes 2a and 2b, either the region between current electrode 2a and voltage electrode 4a, or the region between current electrode 2b and voltage electrode 4b is used as a region not between the voltage electrodes (second region). In the present invention, at least one second region must be formed between current electrodes 2a and 2b. In the present embodiment, one of the current electrodes is used as one of the voltage electrodes. FIG. 8 is a sectional view showing the structure of a magnetic recording element of the magnetic domain wall motion-detecting terminal-possessing magnetic domain wall motion type according to Embodiment 3 of the present invention. Data reading is carried out by passing reading current 8 from electrode 2a to electrode 2b, and measuring the voltage between electrode 4 and electrode 2b. Because the resistance between electrode 4 and the electrode 2b changes according to whether or not magnetic domain wall 3 is present between electrode 4 and electrode 2b, the recorded data can be identified.

Thus, a magnetic recording element of the magnetic domain wall motion-detecting terminal-possessing magnetic domain wall motion type has been described according to the present invention. Many modifications and variations may be made to the techniques and structures described and illustrated herein without departing from the spirit and scope of the invention. Accordingly, it should be understood that the elements and methods described herein are illustrative only and are not limiting upon the scope of the invention.

What is claimed is:

1. A magnetic recording element, comprising:
   a ferromagnetic body;
   a first electrode pair joined to the ferromagnetic body; and
   a second electrode pair joined to the ferromagnetic body at a position other than that to which the first electrode pair is joined;
   wherein the ferromagnetic body has at least one magnetic domain wall therein,
   wherein there is a first gap between members of the second electrode pair and a second gap between one member of the first electrode pair and one of the members of the second electrode pair, whereby the magnetic domain wall can be held in either of the gaps, and
   wherein there is a potential difference between members of the second electrode pair when a current is passed between members of the first electrode pair.

2. A magnetic recording element according to claim 1, wherein the potential difference differs depending on whether the magnetic domain wall is held in the first gap or the second gap.

3. A magnetic recording element according to claim 1, additionally comprising means in a first one of the gaps for pinning the magnetic domain wall.

4. A magnetic recording element according to claim 3, additionally comprising means in a second one of the gaps for pinning the magnetic domain wall.

5. A magnetic recording element according to claim 1, wherein the ferromagnetic body has two magnetic domain walls therein.

6. A magnetic recording element according to claim 5, wherein there are three values for the potential difference between members of the second electrode pair, depending on whether the two magnetic domain walls are held (i) both in the first gap, (ii) both in the second gap, or (iii) one in the first gap and one in the second gap.

7. A magnetic recording element according to claim 6, additionally comprising two means in the first gap for pinning the magnetic domain wall.

* * * * *